US 6,570,186 B1

(12) United States Patent
Uemura et al.

(10) Patent No.: US 6,570,186 B1
(45) Date of Patent: May 27, 2003

(54) LIGHT EMITTING DEVICE USING GROUP III NITRIDE COMPOUND SEMICONDUCTOR

(75) Inventors: Toshiya Uemura, Aichi-ken (JP); Takahide Oshio, Aichi-ken (JP)

(73) Assignee: Toyoda Gosei Co., Ltd., Nishikasugai-gun (JP)

( * ) Notice: Subject to any disclaimer, the term of this patent is extended or adjusted under 35 U.S.C. 154(b) by 0 days.

(21) Appl. No.: 09/568,380

(22) Filed: May 10, 2000

(51) Int. Cl.⁷ .................. H01L 27/15; H01L 33/00; H01L 29/74; H01L 21/00
(52) U.S. Cl. .................. 257/79; 257/88; 257/98; 257/103; 257/163; 257/164; 438/22; 438/24; 438/25; 438/46; 438/47
(58) Field of Search .................. 257/88, 163, 164, 257/79, 103, 98, 184, 198; 438/22, 24, 46, 47, 25, 26, 27, 29

(56) References Cited

U.S. PATENT DOCUMENTS

| | | | |
|---|---|---|---|
| 3,740,622 A | * 6/1973 | Pankove et al. | 257/76 |
| 4,636,821 A | * 1/1987 | Yanase et al. | 257/13 |
| 4,811,352 A | * 3/1989 | Suzuki et al. | 372/45 |
| 5,162,878 A | * 11/1992 | Sasagawa et al. | 257/88 |
| 5,444,270 A | * 8/1995 | Cunningham et al. | 257/98 |
| 5,568,499 A | * 10/1996 | Lear | 372/45 |
| 5,821,569 A | * 10/1998 | Dutta | 257/96 |
| 5,821,571 A | * 10/1998 | Lebby et al. | 257/98 |
| 5,917,202 A | * 6/1999 | Haitz et al. | 257/98 |
| 5,925,896 A | * 7/1999 | Dutta | 257/79 |
| 5,939,735 A | * 8/1999 | Tsutsui et al. | 257/98 |
| 5,952,681 A | * 9/1999 | Chen | 257/89 |
| 6,072,197 A | * 6/2000 | Horino et al. | 257/103 |
| 6,121,636 A | * 9/2000 | Morita et al. | 257/99 |
| 6,339,233 B1 | * 1/2002 | Lell | 257/195 |

FOREIGN PATENT DOCUMENTS

| | | | |
|---|---|---|---|
| JP | 405267709 A | * | 10/1993 |
| JP | 406140621 A | * | 5/1994 |
| JP | 406151955 A | * | 5/1994 |
| JP | 406224406 A | * | 8/1994 |

* cited by examiner

Primary Examiner—Matthew Smith
Assistant Examiner—Chuong A Luu
(74) Attorney, Agent, or Firm—McGinn & Gibb, PLLC (57) ABSTRACT

A wafer comprising a semiconductor layer formed on a substrate is diced on the back surface of the substrate to a depth of about ¾ thickness of the substrate. Thus a separation groove 21 is formed in a direction of a dicing line. A groove 22 is formed at the portion of the semiconductor layer corresponding to the groove 21. The groove 22 reaches the substrate. The back surface 11b of the substrate 11 is polished until the substrate become a lamella having only a trace of the groove 22. A metal layer 10 is formed by depositing aluminum (Al) so as to cover the entire back 11b of the substrate 11, and a groove 23 formed at the portion of the metal layer corresponding to the groove 21. An adhesive sheet 24 is adhered on an electrode pad 20. A scribe line is formed by scribing the metal layer 10 along the groove 23. The wafer is loaded by a roller in a breaking process. Accordingly, a wafer having the metal layer on the back surface 11b of the substrate can be obtained. Light transmitted to the substrate 11 is reflected by the metal layer, resulting in improving effectivity of ejecting light from the electrode 18A and 18B. And a luminous intensity of the device can be also improved.

5 Claims, 10 Drawing Sheets

FIG. 16

LIGHT EMITTING DEVICE USING GROUP III NITRIDE COMPOUND SEMICONDUCTOR

BACKGROUND OF THE INVENTION

1. Field of the Invention

The present invention relates to a light-emitting device using gallium nitride (GaN) group compound semiconductor in which electrodes are formed on the same side to a substrate. Especially, the present invention relates to a light-emitting device whose light ejection quantity from the electrode side of the device is improved.

And the present invention relates to a method for manufacturing a light-emitting device using gallium nitride (GaN) group compound semiconductor device. Especially, the present invention relates to a method for forming a metal layer so as to cover entire back of the substrate.

2. Description of the Related Art

Figure 8:
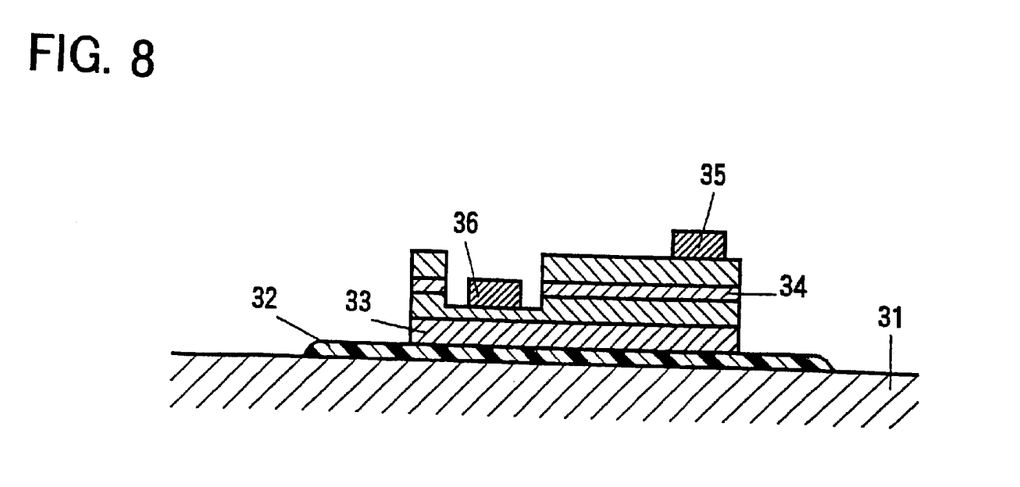
FIG. 8 is a sectional view of a conventional light-emitting device using gallium nitride group compound semiconductor which is fixed on a lead frame in accordance the present invention.

A conventional light-emitting device using GaN group compound semiconductor, which has semiconductor layers laminated on an insulation sapphire substrate and has a positive and a negative electrodes formed on the same side to the substrate, has been known. FIG. 8 illustrates a sectional view of a conventional light-emitting device 30 which is installed on a lead frame 31. The light-emitting device 30 has an emission layer 34 which emits light of a certain wavelength. The positive and the negative electrodes 35 and 36 are formed at the upper side the substrate 33. The entire back of the substrate 33 is die-bonded to the lead frame 31 by using a paste 32 made of resin. Each of the electrodes 35 and 36 is connected to the device at a predetermined portion electrically so that light can be emitted from the electrodes side.

There is not, however, selectivity of direction of the emitted light in the conventional device 30 having a structure shown in FIG. 8. Because the direction of light emitted by the emission layer 34 cannot be selected, light reflected by the back surface of the substrate 33 largely contributes to the quantity of light ejected from the upper surface of the device on which the electrodes 35 and 36 are formed. But the paste 32 which is formed to cover the entire back of the substrate 33 absorbs light, resulting in degrading reflectivity of the substrate. As a result, luminous intensity of the conventional light-emitting device 30 becomes smaller. And because the paste 32 with lapse of time deteriorates (or discolors to be yellow) in the atmosphere or the heat which is generated by driving the device 30, the quantity of reflected light decreases and luminous intensity degrades with lapse of time. Therefore, inventors of the present invention formed a metal layer so as to cover the entire back of the substrate 33, which results in improving the reflectivity and the luminous intensity.

Because the substrate 33 is hard, in order to separate a wafer into each device, the substrate 33 is ordinary polished until it becomes a lamella and then a scribing process and a breaking process are carried out to the back surface of the substrate 33. Thus in a conventional method a metal layer is formed after polishing the substrate. When a metal layer as a reflection layer is formed on the back surface of the substrate 33 before carrying out a scribing process, positioning for scribing the wafer becomes difficult. And when a metal layer is formed after the scribing process, washing the back surface of the wafer becomes difficult and the wafer cannot be heated when the metal layer is formed, because of an adhesive sheet adhered on the side of the wafer where the electrode 35 and 36 are formed. That results in degraded adhesiveness between the metal layer and the back surface of the substrate 33. An oxide film as a reflection film can be formed in place of the metal layer, but there are some difficulties in manufacturing process, e.g., controlling the thickness of the oxide film.

An object of the present invention is, therefore, to improve luminous efficiency of a light-emitting device using gallium nitride group compound semiconductor.

Another object of the present invention is to form a metal layer on a back surface of a substrate. As a result, reflection of light is improved with lapse of time and a quantity of light ejected from the electrode side becomes larger.

Another object of the present invention is to effectively obtain light reflected by the back surface of a sapphire substrate and to improve a quantity of light ejected from the electrode side of the device with lapse of time.

And another object of the present invention is to obtain a light-emitting device which can be manufactured easily.

Each of these objects is aimed at each characteristics of the present invention, so it is not necessary for the present invention to achieve all the objects at one time.

SUMMARY OF THE INVENTION

To achieve the above objects, a first aspect of the present invention is that a light-emitting device, in which at least an n-type nitride group compound semiconductor layer and a p-type gallium nitride group compound semiconductor layer are laminated on a substrate, can emit light in a predetermined region of wavelength. The light-emitting device has a positive and a negative electrodes both formed on the same side to the substrate, and a reflection film formed on the opposite side to the substrate, which reflects light in the predetermined region of wavelength.

The second aspect of the present invention is that the reflection film is a metal layer.

The third aspect of the present invention is that the metal layer is made of aluminum (Al).

The fourth aspect of the present invention is to fix the reflection film on a lead frame by a paste made of resin.

The fifth aspect of the present invention is that the reflection film consists of multiple layers.

And the inventors of the present invention also invented following methods for manufacturing such a device.

A method for manufacturing the light-emitting device using gallium nitride group compound semiconductor comprises the following 6 processes: forming a first groove by cutting a wafer, having a substrate on which a gallium nitride group compound semiconductor layer is formed, from its back surface to a predetermined depth (a first depth) (process 1); cutting at a portion of the upper surface of the wafer, which is corresponding to the portion of the back surface where the first groove is formed, to a predetermined depth (a second depth) (process 2); polishing the back surface of the substrate until the substrate become a lamella having only a trace of the first groove (process 3); forming a metal layer so as to cover the entire back of the substrate (process 4); scribing the metal layer along the first groove (process 5); and breaking the wafer to separate into each devices (process 6).

Through process 1, a wafer having a substrate and gallium nitride group compound semiconductor formed on the substrate is cut on the back surface at a predetermined depth (a first depth). Accordingly, a first groove is obtained. Through process 2, the wafer is cut on a portion of the upper surface, which corresponds to where the first groove is formed, at a predetermined depth (a second depth). Accordingly, a second groove is obtained. Here process 2 may be carried out in advance of process 1. Through process 3, the back surface of the substrate is polished until the substrate becomes to have only a trace of the first groove. Through process 4, a metal layer is formed on the back surface of the substrate. Then, through process 5, a scribing process is carried out to the metal layer along the first groove, and through process 6, the wafer is separated into each device by breaking.

As described above, although the metal layer is formed so as to cover the.back surface of the substrate, positioning for scribing o h the metal layer is easy because of the trace of the first groove which can be recognized through the metal layer. Because of the metal layer formed on the back surface of the substrate, light output from the device to the substrate side is reflected by the metal layer and luminous intensity of the device can be highly improved. And because the reflection does not depend on materials such as resin, emission of the device cannot be deteriorated with lapse of time.

And the present invention also contains the following invention in this specification.

The aspect of the present invention is a light-emitting device which has a substrate and layers made of gallium nitride group compound semiconductor laminated on the substrate, and can emit light in a predetermined region of wavelength. The light-emitting device has a positive and a negative electrodes both formed on the same side to the substrate, and a reflection film formed on the opposite side to the substrate, which reflects light in the predetermined region of wavelength and transmits the light in the region other than the predetermined region.

Then light of the predetermined region of wavelength, which is emitted from the substrate side of the device, can be reflected by the reflection film, resulting in improving the luminous intensity of the device. And because light whose wavelength is out of the predetermined region passes the reflection film, the substrate can be recognized from the reflection film side of the device and separating process becomes easier.

Another aspect of the present invention is to form the reflection film in which a film whose refractive index is smaller than 1.5 and a film whose refractive index is larger than 1.8 are laminated.

This enables the reflection film to reflect light efficiently even if there is lapse of time.

Another aspect of the present invention is to form the reflection film in which a layer whose refractive index is smaller than 1.5 and a layer whose refractive index is larger than 1.8 are laminated in sequent.

By forming a layer made of a material, whose refractive index is small, directly on the substrate, dependence of reflection light on an incident angle can be lowered. As a result, the device can reflect light more effectively.

Another aspect of the present invention is that the layer having refractive index lower than 1.5 comprises at least one of $SiO_2$, $MgF_2$, $CaF_2$, $LiF$, and $AlF_3$, and the layer having refractive index larger than 1.8 comprising at least one of $TiO_2$, $Y_2O_3$, $ZrO_2$, $CeO_2$, $HfO_2$, and $Ta_2O_5$.

Then the reflection film becomes to have a large refractive index in the predetermined wavelength region. And in the other region of wavelength, the reflection film has large transmittivity. Accordingly the reflection film has large wavelength selectivity.

Another aspect of the present invention is to form the reflection film in which a silicon oxide ($SiO_2$) layer and a titanium oxide ($TiO_2$) layer are laminated in sequent.

As a result, the reflection film becomes to have a larger reflectivity in the predetermined wavelength region and larger transmittivity in the other region of wavelength and larger wavelength selectivity as a result.

And another aspect of the present invention is to form the reflection film in which at least 2 pairs of a silicon oxide ($SiO_2$) layer having a thickness about 125 nm and a titanium oxide ($TiO_2$) layer having a thickness about 125 nm are laminated alternately.

As a result, the reflection film having a large reflectivity in the wavelength region of 450 nm to 560 nm and a large transmittivity in the wavelength region of 640 nm to 780 nm can be obtained.

BRIEF DESCRIPTION OF THE DRAWINGS

Other objects, features, and characteristics of the present invention will become apparent upon consideration of the following description and the appended claims with reference to the accompanying drawings, all of which form a part of the specification, and wherein reference numerals designate corresponding parts in the various figures, wherein:

DETAILED DESCRIPTION OF THE PREFERRED EMBODIMENTS

The present invention will be described hereinbelow with reference to specific embodiments.

Figure 1:
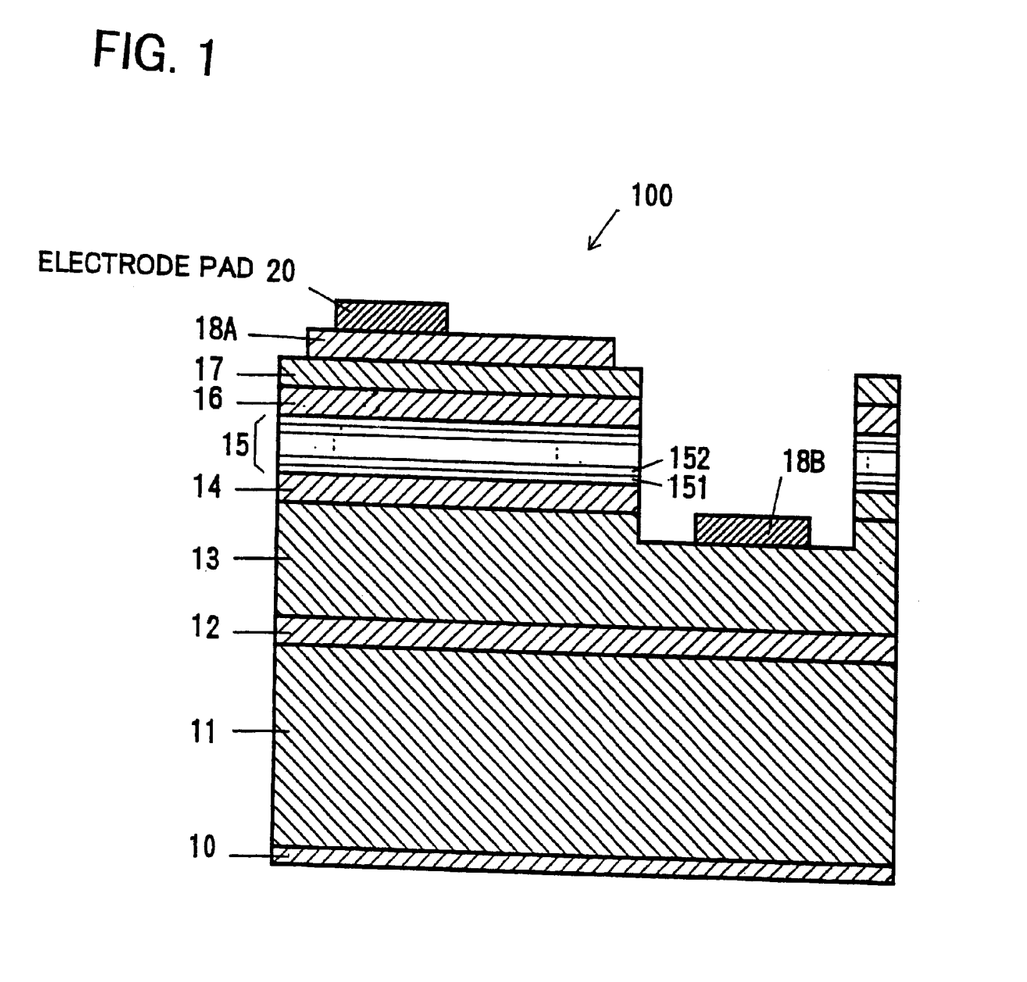
FIG. 1 is a sectional view of a light-emitting device 100 using gallium nitride group compound semiconductor in accordance with the embodiment of the present invention.

FIG. 1 illustrates a sectional view of a light-emitting device 100 using gallium nitride (GaN) group compound semiconductor formed on a sapphire substrate 11. The light-emitting device 100 has a sapphire substrate 11 which has a buffer layer 12 made of nitride aluminum (AlN) having a thickness of about 25 nm, an $n^+$-layer 13 of high carrier concentration, which is made of silicon (Si) doped GaN and has a thickness of about 4.0 $\mu$m, and a cladding layer 14 made of silicon (Si) doped n-type GaN and having a thickness of about 0.5 $\mu$m successively thereon.

An emission layer 15 is constructed with a multi quantum-well (MQW) structure, in which six barrier layers 151 made of GaN having a thickness of about 35 Å and five well layers 152 made of $Ga_{0.8}In_{0.2}N$ having a thickness of about 35 Å are laminated alternately, is formed on the cladding layer 14. A cladding layer 16 made of a p-type $Al_{0.15}Ga_{0.85}N$ having a thickness of about 50 nm is formed on the emission layer 15. Further, a contact layer 17 made of a p-type GaN having a thickness about 100 nm is formed on the cladding layer 16.

An electrode 18A which transmits light is formed by a metal deposit on the contact layer 17 and an electrode 18B is formed on the $n^+$-layer 13. The electrode 18A which transmits light is constructed with about 15 Å in thickness of cobalt (Co), which contacts to the contact layer 17, and about 60 Å in thickness of gold (Au), which contacts to the cobalt (Co). The electrode 18B is constructed with about 200 Å in thickness of vanadium (V) and about 1.8 $\mu$m in thickness of aluminum (Al) or an alloy including aluminum (Al). And an electrode pad 20 having a thickness about 1.5 $\mu$m is formed on the electrode 18A. The electrode pad 20 is made of cobalt (Co), nickel (Ni), and gold (Au) or aluminum (Al), or an alloy including at least one of these metals.

And a metal layer 10 made of aluminum (Al) and having a thickness of about 200 nm is formed so as to cover the entire back of the substrate 11.

Then a method for manufacturing the light-emitting device 100 is explained hereinafter.

Each of the layers of the light-emitting device 100 is formed by gaseous phase epitaxial growth, called metal organic vapor phase deposition (hereinafter MOVPE). The gases employed in this process were ammonia ($NH_3$), a carrier gas ($H_2$ or $N_2$), trimethyl gallium ($Ga(CH_3)_3$) (hereinafter TMG), trimethyl aluminum ($Al(CH_3)_3$) (hereinafter TMA), trimethyl indium ($In(CH_3)_3$) (hereinafter TMI), silane ($SiH_4$), and biscyclopentadienyl magnesium ($Mg(C_5H_5)_2$) (hereinafter $CP_2Mg$).

The single crystalline sapphire substrate 11 was placed on a susceptor in a reaction chamber for the MOVPE treatment after its main surface 'a' was cleaned by an organic washing solvent and heat treatment. Then the sapphire substrate 11 was baked at 1100° C. by $H_2$ vapor fed into the chamber under normal pressure.

About 25 nm in thickness of AlN buffer layer 12 was formed on the surface 'a' of the baked sapphire substrate 11 under conditions controlled by lowering the temperature in the chamber to 400° C., keeping the temperature constant, and concurrently supplying $H_2$, $NH_3$ and TMA.

About 4.0 $\mu$m in thickness of GaN was formed on the buffer layer 12, as an $n^+$-layer 13 of high carrier concentration having an electron concentration of $2\times10^{18}/cm^3$, under conditions controlled by keeping the temperature of the sapphire substrate 11 at 1150° C. and concurrently supplying $H_2$, $NH_3$, TMG and silane.

About 0.5 $\mu$m in thickness of GaN was formed on the $n^+$-layer 13, as a cladding layer 14, having an electron concentration of $2\times10^{18}/cm^3$ under conditions controlled by keeping the temperature of the sapphire substrate 11 to 1150° C. and concurrently supplying $N_2$ or $H_2$, $NH_3$, TMG, TMI and silane.

Then about 35 Å in thickness of a barrier layer 151 made of GaN was formed under conditions controlled by concurrently supplying $N_2$ or $H_2$, $NH_3$, TMG and TMA. And about 35 Å in thickness of $Ga_{0.8}In_{0.2}N$ was formed on the barrier layer 151, as a well layer 152, concurrently supplying $N_2$ or $H_2$, $NH_3$, TMG and TMI. Similarly, four pairs of the barrier layer 151 and the well layer 152 were formed in sequence under the same respective conditions, and then a barrier layer 151 made of GaN was formed thereon. Accordingly, an emission layer 15 having a multiple quantum well (MQW) structure with five periods was formed.

About 50 nm in thickness of Mg-doped p-type $Al_{0.15}Ga_{0.85}N$ was formed on the emission layer 15, as a cladding layer 16, under conditions controlled by keeping the temperature of the sapphire substrate 11 at 1100° C. and concurrently supplying $N_2$ or $H_2$, $NH_3$, TMG, TMA and $CP_2Mg$.

About 100 nm in thickness of Mg-doped p-type GaN was formed on the p-cladding layer 16, as a contact layer 17, under conditions controlled by keeping the temperature of the sapphire substrate 11 at 1100° C. and concurrently supplying $N_2$ or $H_2$, $NH_3$, TMG, and $CP_2Mg$.

An etching mask is formed on the contact layer 17, and a predetermined region of the mask is removed. Then, exposed portions of the contact layer 17, the p-cladding layer 16, the emission layer 15, the cladding layer 14, and some part of the $n^+$-layer 13 were etched by a reactive ion etching using gas including chlorine (Cl). Accordingly, the surface of the $n^+$-layer 13 was exposed.

Then, an electrode 18B and an electrode 18A which transmits light were formed on the $n^+$-layer 13 and the contact layer 17, respectively, as follows.

(1) A photoresist layer was laminated on the $n^+$-layer 13. A window was formed on a fixed region of the exposed surface of the $n^+$-layer 13 by patterning using photolithography. After exhausting in high vacuum lower than $10^{-6}$ Torr vacuum order, about 200 Å in thickness of vanadium (V) and about 1.8 μm in thickness of aluminum (Al) were deposited on the window. Then, the photoresist layer laminated on the n$^+$-layer 13 was removed. Accordingly, the electrode 18B was formed on the exposed surface of the n$^+$-layer 13.

(2) A photoresist layer was laminated on the contact layer 17. The photoresist layer of an electrode forming part on the contact layer 17 was removed by patterning using photolithography, and a window was formed there.

(3) After exhausting in high vacuum lower than $10^{-6}$ Torr vacuum order, about 15 Å in thickness of cobalt (Co) and about 60 Å in thickness of gold (Au) were formed in sequence on the photoresist layer and the exposed surface of the contact layer 17 in a reaction chamber for deposit.

(4) The sample was took out from the reaction chamber for deposit. Then cobalt (Co) and gold (Au) laminated on the photoresist layer were removed by a lift-off, and an electrode 18A which transmits light is formed on the contact layer 17.

(5) To form an electrode pad 20 for a bonding, a window was formed on a photoresist layer, which was laminated uniformly on the electrode 18A. About 1.5 μm in thickness of cobalt (Co) or nickel (Ni), gold (Au) and aluminum (Al) or an alloy including at least one of those metals were deposited on the photoresist layer. Then, as in the process (4), cobalt (Co) or nickel (Ni), gold (Au) and aluminum (Al) or an alloy including at least one of those metals laminated on the photoresist layer were removed by a lift-off, and an electrode pad 20 was formed.

(6) After the atmosphere of the sample was exhausted by a vacuum pump, O$_2$ gas was supplied until the pressure becomes 3 Pa. Under conditions controlled by keeping the pressure constant and keeping the temperature of the atmosphere about 550° C., the sample was heated for about 3 min. Accordingly, the contact layer 17 and the cladding layer 16 were changed to have lower resistive p-type, and the contact layer 17 and the electrode 18A, and the n$^+$-layer 13 and the electrode 18B, respectively, are alloyed. Through the process of (1) to (6), a wafer which does not have a metal layer 10 was formed.

Forming a metal layer 10 and separating the wafer are explained by using FIGS. 2–7 hereinafter.

Figure 2:
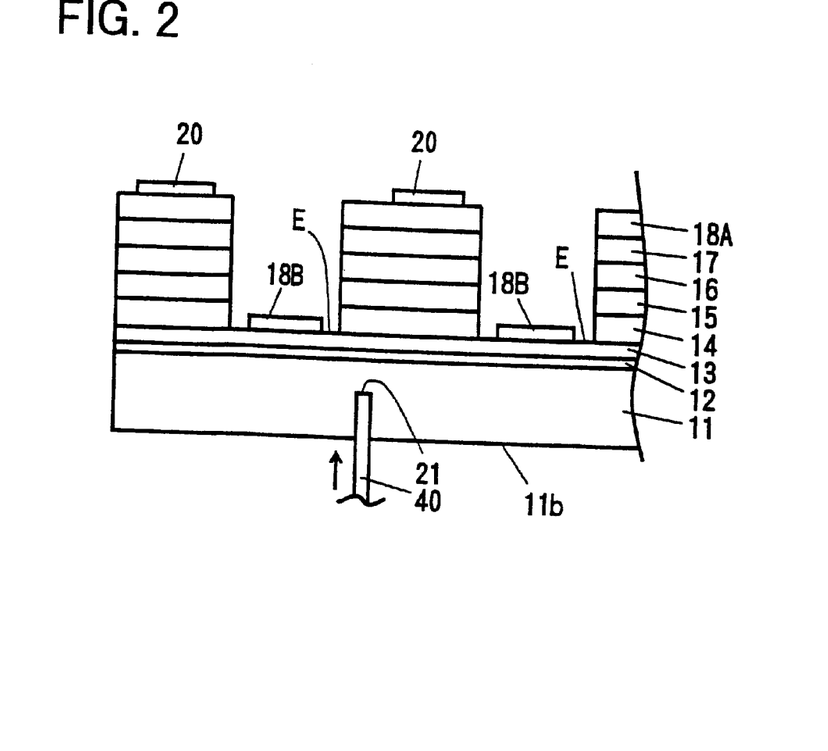
FIG. 2 is a view showing process 1 of a method for manufacturing a light-emitting device 100 using gallium nitride group compound semiconductor in accordance with the embodiment of the present invention.

FIG. 2 shows a sectional view of the wafer. A separation groove (a first groove) 21, which has a depth of about ¾ thickness of the substrate 11 (a first depth) from a surface 11b of the substrate 11, was formed in a direction of the dicing line by using a blade 40 (process 1).

Figure 3:
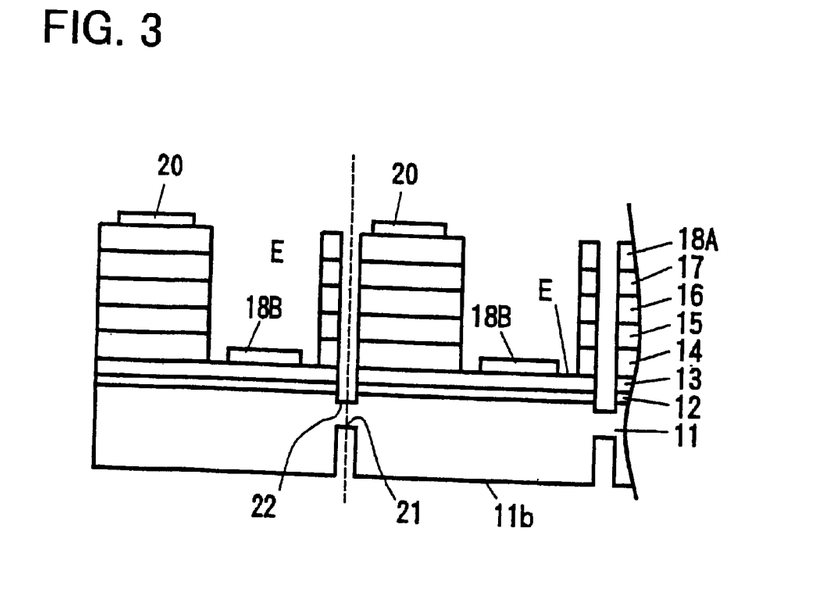
FIG. 3 is a view showing process 2 of a method for manufacturing a light-emitting device 100 using gallium nitride group compound semiconductor in accordance with the embodiment of the present invention.

Then a separation groove 22 (a second groove), which has a depth of about 15 μm (a second depth), was formed from the opposite side of the surface 11b of the substrate 11, or semiconductor side of the wafer by using the blade 40. In result, the wafer whose sectional view is shown in FIG. 3 can be obtained (process 2).

Figure 4:
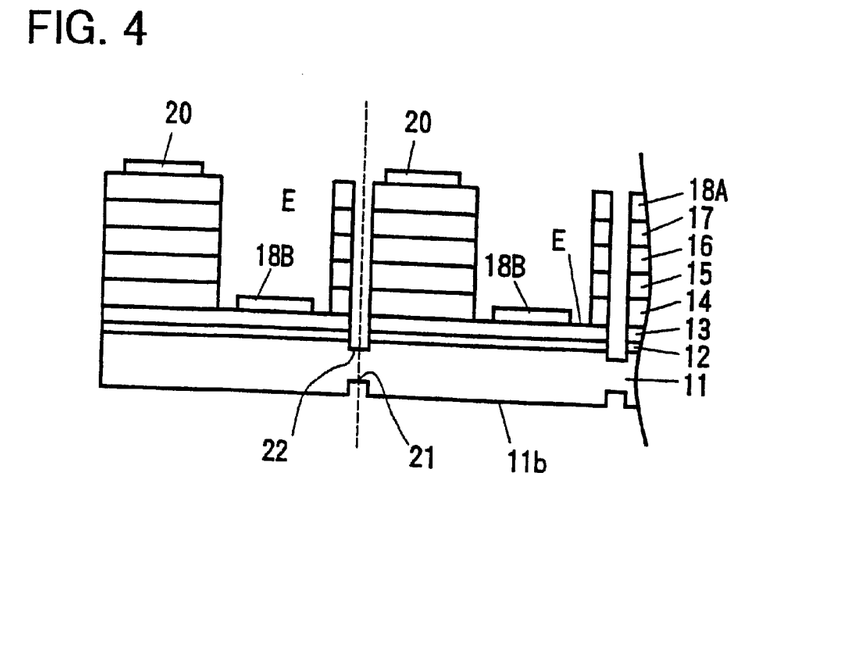
FIG. 4 is a view showing process 3 of a method for manufacturing a light-emitting device 100 using gallium nitride group compound semiconductor in accordance with the embodiment of the present invention.

The back surface 11b of the substrate 11 was polished by a lapping machine until the substrate 11 become a lamella having only a trace of the groove 21 (process 3). Accordingly, a wafer whose sectional view is shown in FIG. 4 can be obtained.

Figure 5:
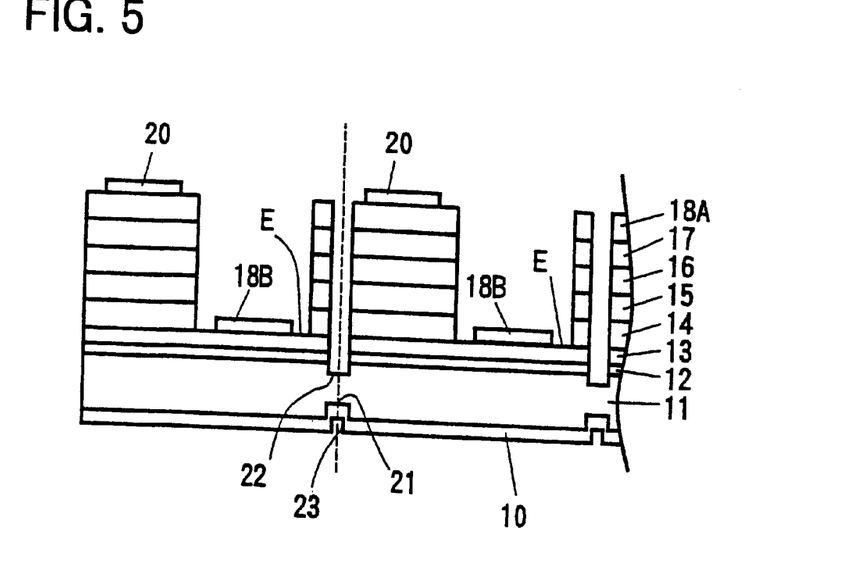
FIG. 5 is a view showing process 4 of a method for manufacturing a light-emitting device 100 using gallium nitride group compound semiconductor in accordance with the embodiment of the present invention.

A metal layer 10 having a thickness of about 200 nm was formed by depositing aluminum (Al) so as to cover the entire back surface 11b of the substrate 11 (process 4). Accordingly, a wafer whose sectional view is shown in FIG. 5 can be obtained. As shown in FIG. 5, a groove 23 was formed at the portion of the metal layer 10 corresponding to the groove 22.

Figure 6:
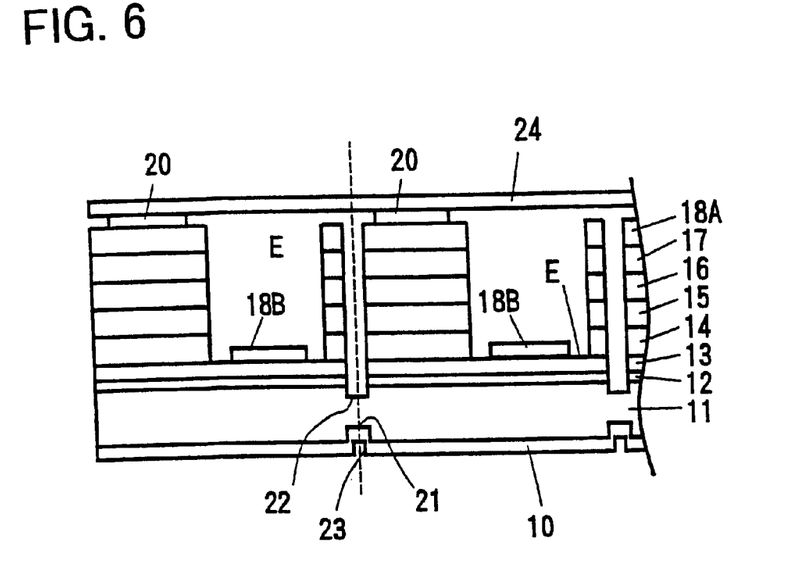
FIG. 6 is a view showing a method for manufacturing a light-emitting device 100 using gallium nitride group compound semiconductor in accordance with the embodiment of the present invention, when an adhesive sheet is adhered on an electrode pad.

An adhesive sheet 24 was adhered on the electrode pad 20 as shown in FIG. 6.

Figure 7:
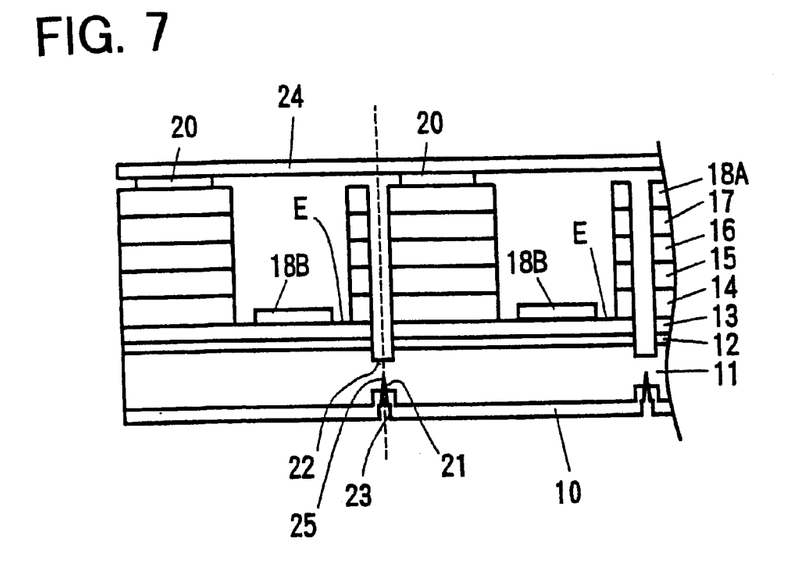
FIG. 7 is a view showing process 5 of a method for manufacturing a light-emitting device 100 using gallium nitride group compound semiconductor in accordance with the embodiment of the present invention.

A scriber was used to scribe the groove 23 formed on the metal layer 10. Accordingly, a scribe line 25 was obtained as shown in FIG. 7 (process 5).

The wafer was loaded by a roller in a breaking process (process 6). As a result, a wafer having the structure shown in FIG. 1 can be obtained.

As described above, by forming the metal layer 10 on the back surface 11b of the substrate 11 having the separation groove 21, the groove 23 can be formed on at the portion of the metal layer 10 corresponding to the groove 21. As a result, positioning for scribing the wafer at the side of the metal layer 10 becomes easier. Accordingly, a light-emitting device 100 which has the metal layer 10 on the back surface 11b of the substrate 11 can be manufactured. Because the metal layer 10 was formed before adhering the adhesive sheet 24, the metal layer 10 can be formed by depositing in a heating process so that the metal layer 10 can be adhesive to the back surface 11b of the substrate 11.

Because light transmitted into the substrate 11 can be reflected effectively by the metal layer which is formed on the back surface 11b, effectivity of ejecting light from the electrode 18A and 18B can be improved, and a luminous intensity can be also improved. And because the metal layer does not deteriorate with lapse of time, the light-emitting device 100 can emit stable light regardless of time.

In the embodiment, the separation groove 22 was formed at the opposite side of the substrate after forming the separation groove 21. Alternatively, the separation groove 22 can be formed before forming the separation groove 21.

In the embodiment, the metal layer 10 made of Al and having a thickness of about 200 nm was formed by deposition process. Alternatively, the metal layer 10 can be made of any metal which has enough thickness to reflect light. Further alternatively, other process can be used to form the metal layer 10.

In the embodiment, the separation groove 22 has a depth of about 15 nm. Alternatively, the thickness of the separation groove 22 can be in a range of 5 nm to 50 nm. In the embodiment, the separation groove 21 has a depth of about ¾ thickness of the substrate 11. Alternatively, the depth of the separation groove 21 can be in a range of ½ to ⅚ thickness of the substrate 11.

The emission layer 15 formed in the light-emitting device 100 has an MQW structure. Alternatively, the emission layer 15 can have an SQW structure or comprise single layer made of materials such as $Ga_{0.8}In_{0.2}N$. Further alternatively, the emission layer 15 can be made of quaternary or ternary AlGaInN having an arbitrary composition ratio. In the embodiment, magnesium (Mg) was used as a p-type impurity. Alternatively, group II elements such as beryllium (Be), zinc (Zn), etc. can be used.

The device in the present invention can be applied not only to a light-emitting device but also a light-receiving device.

Other embodiment is explained hereinafter.

Figure 9:
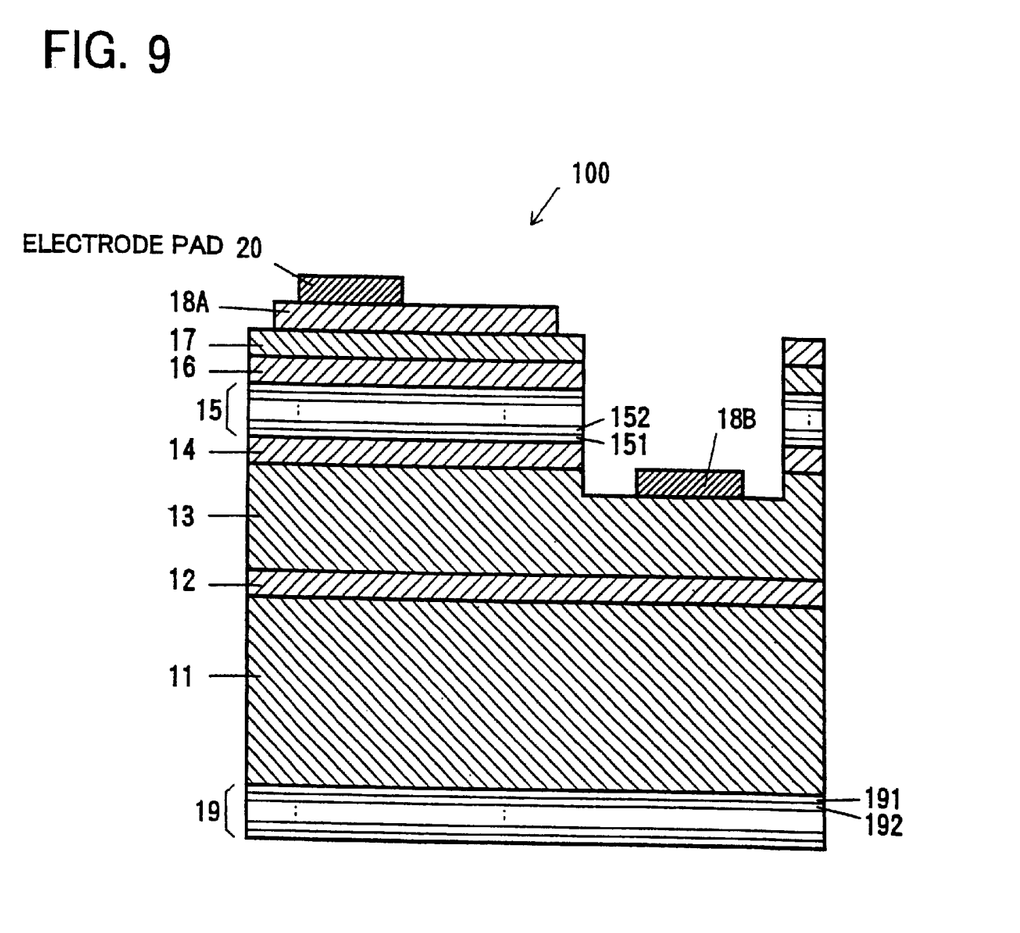
FIG. 9 is a sectional view showing a structure of a light-emitting device 100 using gallium nitride group compound semiconductor in accordance with other embodiment of the present invention.

FIG. 9 illustrates a sectional view of a light-emitting device 100 using gallium nitride (GaN) group compound semiconductor formed on a sapphire substrate 11. A buffer layer 12, an n$^+$-layer 13 of high carrier concentration, a cladding layer 14, an emission layer 15 having a multiple quantum well (MQW) structure in which barrier layers 151 and well layers 152 are laminated alternately, a cladding layer 16, a contact layer 17, and electrodes 18A and 18B formed on the substrate 11 are completely identical to those in the above embodiment.

In this embodiment, a reflection film 19, in which 10 periods of a pair of a first reflection film 191 and a second reflection film 192 were laminated, was formed so as to cover the entire back of the substrate 11. The first reflection film 19 was made of silicon oxide ($SiO_2$) with a thickness of about 125 nm. The second reflection film 192 was made of titanium oxide ($TiO_2$) with a thickness of about 125 nm.

In this embodiment, the pair of the reflection films 191 and 192 were laminated in 10 periods. Although the reflection film 19 can function effectivley by laminating at least 2 periods, the pairs should be preferably laminated over 10 periods.

Then a method for manufacturing the light-emitting device 100 is explained hereinafter.

Forming the layers from the buffer layer 12 to the electrodes 18A and 18B is identical with that in the above embodiment.

Accordingly, a wafer without the reflection film 19 was manufactured.

Methods of forming the reflection film 19 and separating the device shown in FIGS. 10–15 are explained hereinafter.

Figure 10:
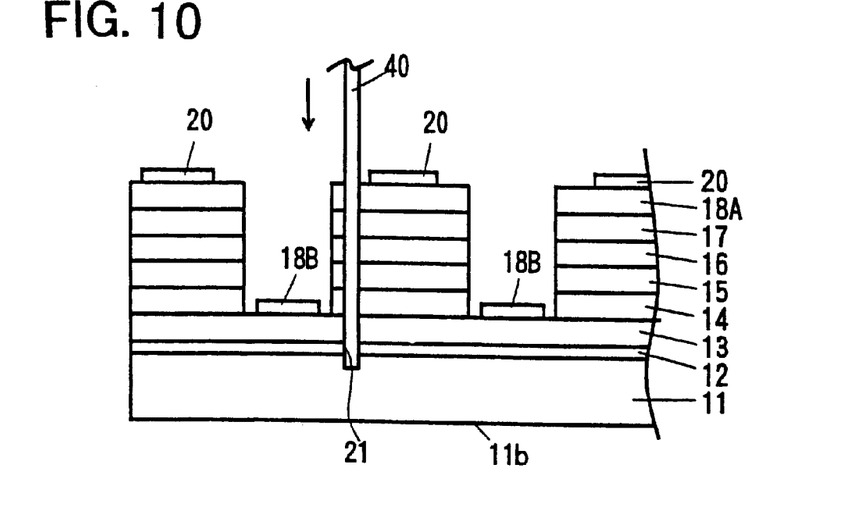
FIG. 10 is a view showing a dicing process of a light-emitting device 100 using gallium nitride group compound semiconductor in accordance with other embodiment of the present invention.

FIG. 10 illustrates a sectional view of the light-emitting device 100. A blade 40 was moved from the surface of an electric pad 20 until it reaches a substrate 11. Accordingly, a wafer was diced and a separation groove 21 was formed.

Figure 11:
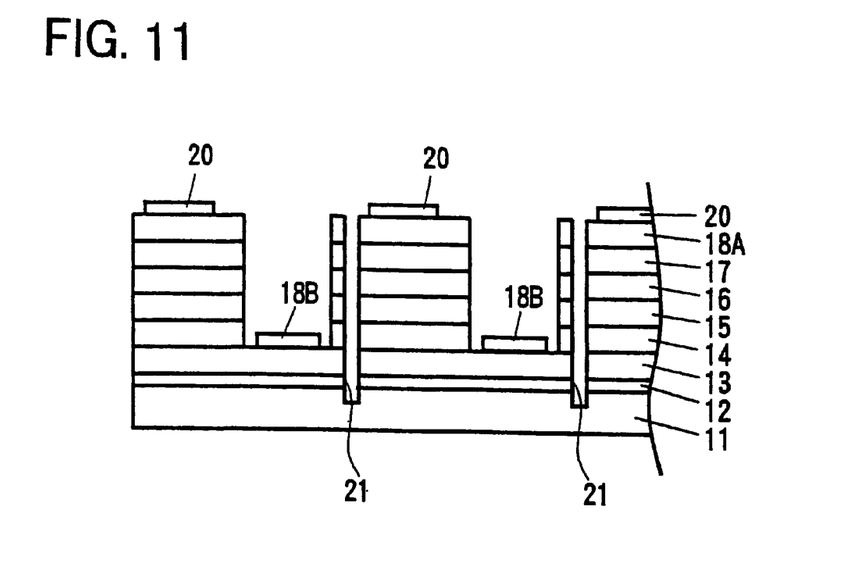
FIG. 11 is a view showing a polishing process of a light-emitting device 100 using gallium nitride group compound semiconductor in accordance with other embodiment of the present invention.

The back surface 11b of the substrate 11 was polished by a lapping machine until the substrate 11 become a lamella having only a trace of the groove 21. Accordingly, a wafer whose sectional view is shown in FIG. 11 can be obtained.

Figure 12:
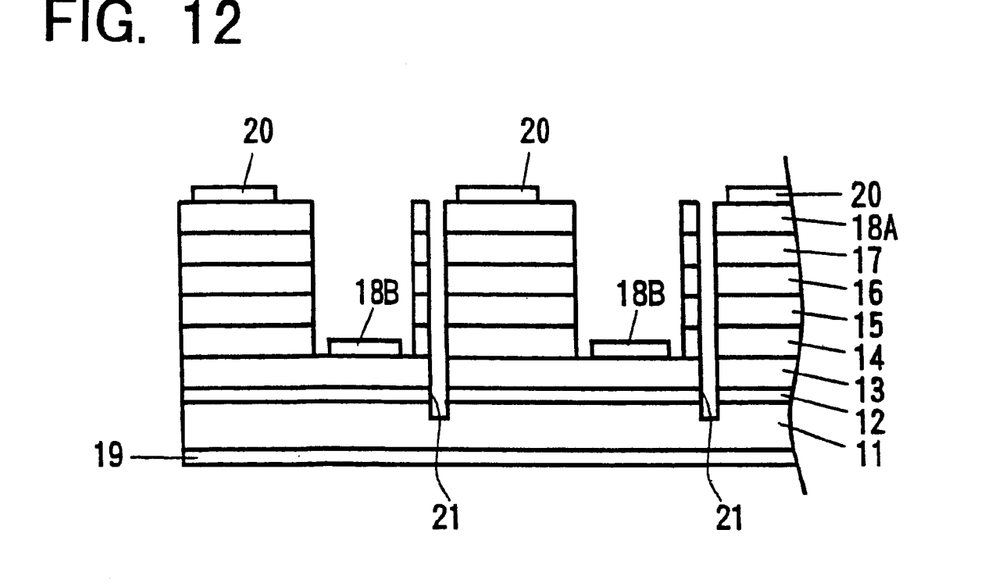
FIG. 12 is a view showing a process to form a reflection film in light-emitting device 100 using gallium nitride group compound semiconductor in accordance with other embodiment of the present invention.
Figure 13:
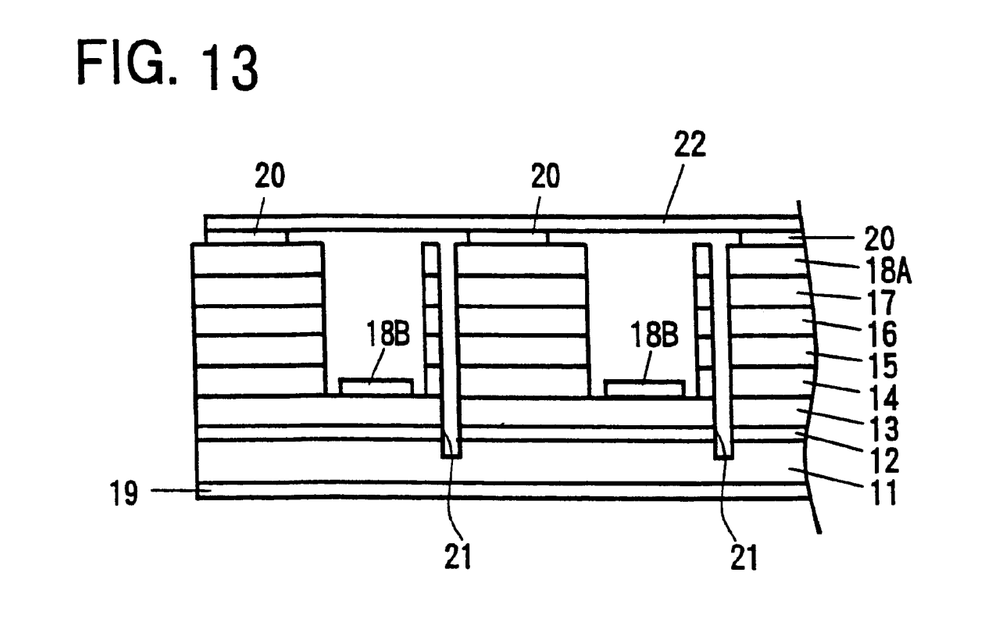
FIG. 13 is a view showing a method for manufacturing a light-emitting device 100 using gallium nitride group compound semiconductor in accordance with other embodiment of the present invention when an adhesive sheet is adhered on an electrode pad.
Figure 14:
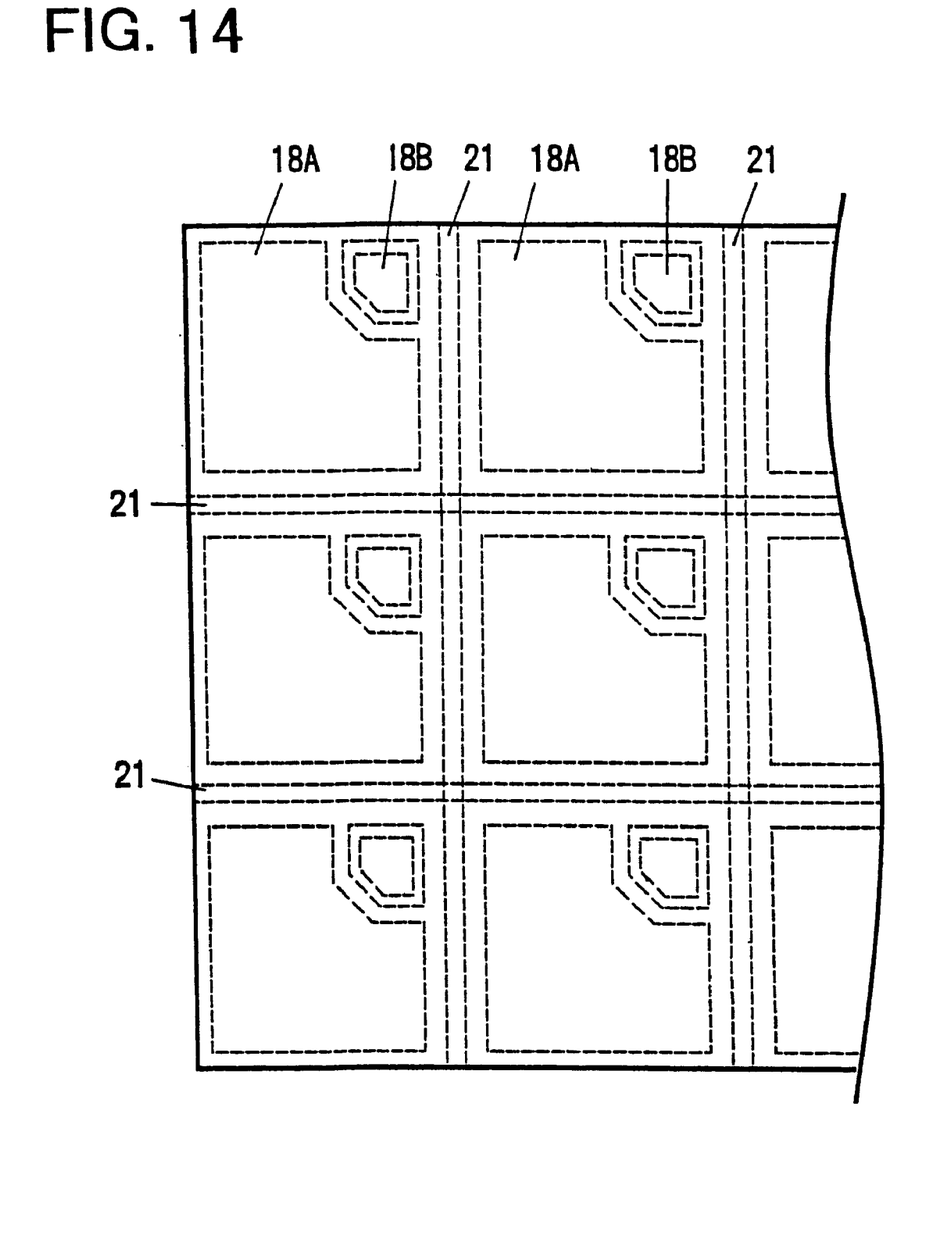
FIG. 14 is a view from the bottom of a wafer of a light-emitting device 100 using gallium nitride group compound semiconductor in accordance with other embodiment of the present invention.

10 pairs of a first reflection film made of silicon oxide ($SiO_2$) with a thickness of about 125 nm and a second reflection film made of titanium oxide ($TiO_2$) with a thickness of about 125 nm were laminated on the back surface 11b of the substrate 11. Accordingly, a reflection film 19 as shown in FIG. 12 was obtained. An adhesive sheet 22 was adhered on the electrode pad 20 as shown in FIG. 13. FIG. 14 is a view of the light-emitting device 100 from the reflection film 19. Because a portion where a separation groove 21 was formed is thinner than other part of the wafer, the separation groove 21 can be recognized through the reflection film 19.

Figure 15:
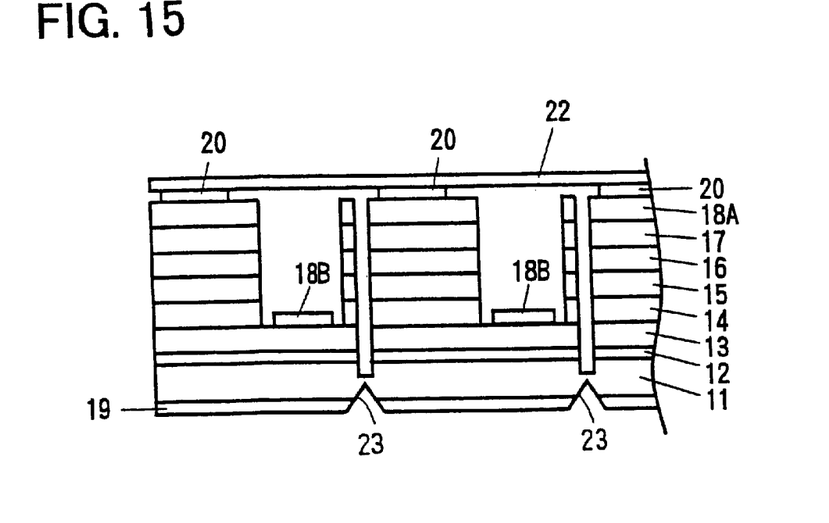
FIG. 15 is a view of a scribing process of a light-emitting device 100 using gallium nitride group compound semiconductor in accordance with other embodiment of the present invention.

A scriber was used to scribe at the portion of the reflection film 19 corresponding to the groove 21, until the groove reaches the substrate 11. Accordingly, a scribe line 23 was obtained as shown in FIG. 15.

The wafer was loaded by a roller so that the wafer can be separated into chips. As a result, a wafer having the structure shown in FIG. 9 can be obtained.

Figure 16:
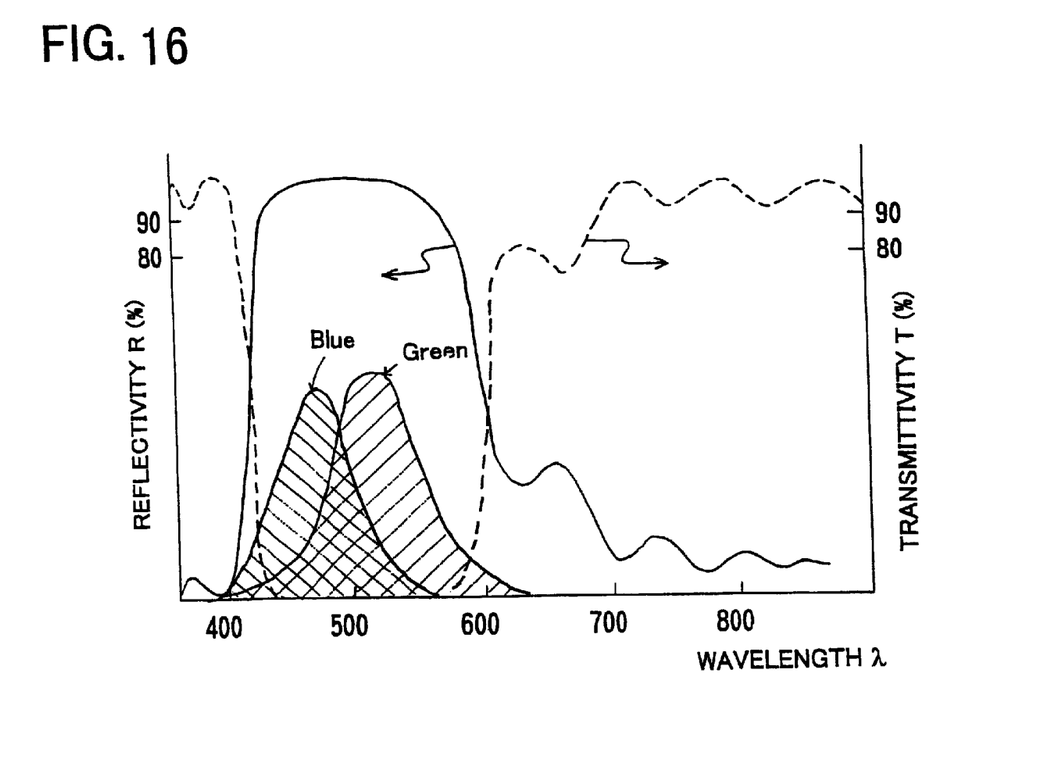
FIG. 16 is a view showing an emission spectrum of a light-emitting device 100 using gallium nitride group compound semiconductor in accordance with other embodiment of the present invention.

As described above, by forming the reflection film 19 on the back surface 11b of the substrate 11 having the separation groove 21, light emitted by the emission layer 15 can be reflected effectively. FIG. 16 is a graph showing an emission spectrum of the emission layer 15 and a reflectivity of the reflection film 19. As shown in FIG. 16, a wavelength region of the emission spectrum is in a region when the reflectivity of the reflection film 19 is more than 90%. Thus the reflection film 19 can reflect light effectively, and luminous intensity can be improved. In this embodiment, by laminating 10 pairs of the first reflection film 191 made of $SiO_2$ with a thickness of about 125 nm and the second reflection film 192 made of $TiO_2$ with a thickness of about 125 nm, the reflectivity becomes more than 90% in the wavelength region of 450 nm to 560 nm, and the transmittivity becomes more than 80% in the wavelength region of 640 nm to 780 nm.

Alternatively, by laminating a layer made of $SiO_2$, a material of low refractive index (refractive index n=1.45), on the substrate 11 and then laminating a layer $TiO_2$, a material of high refractive index (refractive index n=2.3), on the $SiO_2$ layer, the dependence of a light reflection on an incident angle can be lowered. As a result, the device can reflect light more effectively.

Because the reflection film 19 transmits light, the separation groove 21 formed by dicing process can be recognized through the reflection film 19. Because of that, scribing the substrate 11 after forming the reflection film 19 becomes possible, and manufacturing the device 100 becomes easier.

The structure of the reflection film 19 cannot be limited to that disclosed in the above embodiment. That is, an arbitrary thickness, lamination order and periodicity can be applied to each of the first and the second reflection films 191 and 192 as long as the reflection film 19 can reflect light in the wavelength region of the device 100.

In the embodiment, the light-emitting device 100 has the emission layer 15 with multi quantum-well (MQW) structure. Alternatively, the emission layer 15 can have a single quantum-well (SQW) structure or a single layer made of a $Ga_{0.8}In_{0.2}N$. Further alternatively, the emission layer 15 can be made of quaternary or ternary AlGaInN. In the second embodiment, magnesium (Mg) was used as a p-type impurity. Alternatively, Group II elements such as beryllium (Be), zinc (Zn), etc. can be used.

The device in the present invention can be applied not only to a light-emitting device such as LEDs and LDs but also a light-receiving device.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A light-emitting device using gallium nitride group compound semiconductor comprising:

a substrate;

at least an n-type nitride group compound semiconductor layer and a p-type gallium nitride group compound semiconductor layer laminated on said substrate;

a positive electrode and a negative electrode both formed on the same side to said substrate; and a reflection film formed on the entire surface of the opposite side to said substrate which reflects light in a first region of wavelength, wherein said light-emitting device can emit light of the first region of wavelength and said reflection film is a metal layer formed and adhered to said substrate by depositing in a heating process and said reflection film transmits light in a second region of wavelength different from said first region of wavelength of said emitted light.

2. A light-emitting device using gallium nitride group compound semiconductor according to claim 1, wherein said metal layer is made of aluminum (Al).

3. A light-emitting device using gallium nitride group compound semiconductor according to claim 1, wherein said reflection film is fixed on a lead frame by paste using materials such as resin.

4. A light-emitting device using gallium nitride group compound semiconductor comprising:

a substrate, the substrate having a first major surface and a second major surface;

a first semiconductor layer formed on the first major surface of the substrate, the first layer comprising a nitride group compound semiconductor of a first conductivity type;

a second semiconductor layer formed on the first semiconductor layer, the second layer comprising a nitride group compound semiconductor of a second conductivity type;

a portion of the second semiconductor layer being removed to expose a surface of the first semiconductor layer;

a first contact formed on the exposed surface of the first semiconductor layer;

a second contact formed on the second semiconductor layer;

a substantially continuous hot metal layer directly on the second major surface of the substrate, the reflective film reflecting at least 85% of incident light in the 450–550 nm wavelength and transmitting more than 80% of incident light in the 640–780 nm wavelength.

5. A light-emitting device using gallium nitride group compound semiconductor according to claim 4, wherein the reflective layer is formed by a heat treatment.

* * * * *

UNITED STATES PATENT AND TRADEMARK OFFICE
CERTIFICATE OF CORRECTION

PATENT NO. : 6,570,186 B1
DATED : May 27, 2003
INVENTOR(S) : Toshiya Uemura and Takahide Oshio It is certified that error appears in the above-identified patent and that said Letters Patent is hereby corrected as shown below:

<u>Column 12,</u>
Line 5, please correct claim 4 to read:
-- 4. A light-emitting device using gallium nitride group compound semiconductor comprising:
 a substrate, the substrate having a first major surface and a second major surface;
 a first semiconductor layer formed on the first major surface of the substrate, the first layer comprising a nitride group compound semiconductor of a first conductivity type;
 a second semiconductor layer formed on the first semiconductor layer, the second layer comprising a nitride group compound semiconductor of a second conductivity type;
 a portion of the second semiconductor layer being removed to expose a surface of the first semiconductor layer;
 a first contact formed on the exposed surface of the first semiconductor layer;
 a second contact formed on the second semiconductor layer;
 a substantially continuous [hot metal layer ] <u>refective film formed</u> directly on the second major surface of the substrate, the reflective film reflecting at least 85% of incident light in the 450-550 nm wavelength and transmitting more than 80% of incident light in the 640-780 nm wavelengh. --

Signed and Sealed this

Ninth Day of September, 2003

JAMES E. ROGAN
*Director of the United States Patent and Trademark Office*